(12) United States Patent
Nakaguchi et al.

(10) Patent No.: US 10,903,644 B2
(45) Date of Patent: Jan. 26, 2021

(54) CONTROL DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Shinnosuke Nakaguchi, Mie (JP); Masayuki Kato, Mie (JP); Shunichi Sawano, Mie (JP); Takeo Uchino, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 167 days.

(21) Appl. No.: 16/278,384

(22) Filed: Feb. 18, 2019

(65) Prior Publication Data

US 2019/0260197 A1 Aug. 22, 2019

(30) Foreign Application Priority Data

Feb. 22, 2018 (JP) .................................. 2018-029961

(51) Int. Cl.
| | |
|---|---|
| *H02H 3/00* | (2006.01) |
| *H02H 9/08* | (2006.01) |
| *H02H 3/16* | (2006.01) |
| *H03K 17/0812* | (2006.01) |
| *H03K 17/687* | (2006.01) |
| *H03K 17/06* | (2006.01) |

(52) U.S. Cl.
CPC ............... *H02H 3/16* (2013.01); *H03K 17/06* (2013.01); *H03K 17/08122* (2013.01); *H03K 17/6874* (2013.01); *H03K 2017/066* (2013.01)

(58) Field of Classification Search
CPC .... H02H 3/16; H03K 17/08122; H03K 17/06; H03K 17/6874; H03K 17/16
USPC ............................................................ 361/42
See application file for complete search history.

(56) References Cited

U.S. PATENT DOCUMENTS

| | | | | |
|---|---|---|---|---|
| 6,222,346 B1* | 4/2001 | Mori | ...................... | H02J 7/0031 320/134 |
| 7,830,120 B2* | 11/2010 | Ibrahim | ................ | H02J 7/0029 320/134 |
| 2005/0007711 A1* | 1/2005 | Liu | ........................ | H02H 3/202 361/90 |

FOREIGN PATENT DOCUMENTS

JP 2007-082374 A 3/2007

\* cited by examiner

*Primary Examiner* — Jared Fureman
*Assistant Examiner* — Lucy M Thomas
(74) *Attorney, Agent, or Firm* — Honigman LLP

(57) ABSTRACT

Provided is a control device that stops the power supply when the first FET is short-circuited. In the control device, a boost circuit increases the voltage of one end of a resistor on the boost circuit side to a predetermined voltage that is higher than the source voltage of the first FET. An AND circuit instructs the discharge circuit to decrease the voltage at the other end of the resistor when the voltage at the other end of the resistor is less than a threshold voltage if the AND circuit instructs the boost circuit to increase the voltage at the one end of the resistor on the boost circuit side. The threshold voltage exceeds the voltage at the one end of the resistor if the voltage at the one end of the resistor on the boost circuit is the predetermined voltage and if the first FET is short-circuited.

12 Claims, 8 Drawing Sheets

Legend:
A= Predetermined time

CONTROL DEVICE

CROSS-REFERENCE TO RELATED APPLICATIONS

This application claims priority of Japanese Patent Application No. JP 2018-029961 filed Feb. 22, 2018.

TECHNICAL FIELD

The present disclosure relates to a control device.

BACKGROUND

A control device that controls the supply of power from a battery to a load is mounted to a vehicle (see e.g., JP 2007-82374A). The control device includes a first FET and a second FET. The first FET and the second FET are of the N-channel type. The drain of the first FET is connected to the drain of the second FET. The source of the first FET is connected to the positive electrode of the battery. The source of the second FET is connected to one end of the load. The negative electrode of the battery is connected to the other end of the load.

For each of the first FET and the second FET, the higher the voltage at the gate, the smaller the resistance value between the drain and the source is. Therefore, if the gate voltages of the first FET and the second FET are high, the battery and the load are electrically connected, so that current flows from the battery to the load via the first FET and the second FET, and power is supplied to the load. If the gate voltages of the first FET and the second FET are low, the electrical connection between the battery and the load is interrupted, so that no current flows via the first FET and the second FET, and the supply of power to the load is stopped. The supply of power from the battery to the load is controlled by adjusting the gate voltages of the first FET and the second FET.

SUMMARY

With the control device described in JP 2007-82374A, the gate voltages of the first FET and the second FET are adjusted to a voltage higher than the output voltage of the battery when power is supplied to the load. Therefore, if the source and the gate of the first FET are short-circuited, the gate voltage of the first FET is equal to the output voltage of the battery, and is low.

A parasitic diode whose cathode and anode are connected to the drain and the source, respectively, is formed in each of the first FET and the second FET. If the source and the gate of the first FET are short-circuited in a state in which the gate voltage of the second FET is high, current flows through the parasitic diode of the first FET and the second FET in this order because the resistance value between the drain and the source of the first FET is large. When current flows via the parasitic diode, the temperature of the first FET is rapidly increased, resulting in the possibility that the first FET may fail. For this reason, if the source and the gate of the first FET are short-circuited, it is necessary to stop the supply of power via the first FET and the second FET, thus stopping the passage of current via the parasitic diode.

Control devices that control the supply of power from the battery to the load include a control device in which the source of the first FET is connected to the drain of the second FET. In this case, the drain of the first FET is connected to the positive electrode of the battery, the source of the second FET is connected to one end of the load, and the negative electrode of the battery is connected to the other end of the load. In this case, even if the drain and the gate of the first FET are short-circuited, the gate voltage of the first FET is equal to the output voltage of the battery, and is low. At this time, the gate voltage of the first FET is not low enough to be able to interrupt the passage of current via the drain and the gate of the first FET.

Accordingly, if the drain and the gate of the first FET are short-circuited in a state in which the gate voltage of the second FET is high, current flows through the first FET and the second FET in this order. At this time, the resistance value between the drain and the source of the first FET is not sufficiently small, and, therefore, the amount of heat generated in the first FET is large, and the temperature of the first FET is rapidly increased, resulting in the possibility that the first FET may fail. For this reason, if the drain and the gate of the first FET are short-circuited in a configuration in which the source of the first FET is connected to the drain of the second FET, it is necessary to stop the supply of power via the first FET and the second FET, thus stopping the passage of current via the parasitic diodes.

The present disclosure has been made in view of such circumstances, and it is an object of the disclosure to provide a control device that stops the supply of power via the first FET and the second FET if the source (or the drain) and the gate of the first FET are short-circuited.

A control device according to an aspect of the present disclosure includes: an N-channel first FET; an N-channel second FET whose drain is connected to a drain (or a source) of the first FET; a first resistor that is connected between gates of the first FET and the second FET; a second resistor whose one end is connected to the gate of the second FET; a boost circuit that is connected to the other end of the second resistor, the boost circuit being configured to increase a voltage at the other end of the second resistor to a predetermined voltage that is higher than a voltage of the source (or the drain) of the first FET; a buck circuit configured to decrease a voltage at the one end of the second resistor; and an instructing unit configured to instruct the boost circuit to increase the voltage at the other end of the second resistor, wherein the instructing unit is configured to instruct the buck circuit to decrease the voltage at the one end of the second resistor when the voltage at the one end of the second resistor is less than a threshold voltage if the instructing unit instructs the boost circuit to increase the voltage at the other end of the second resistor, the threshold voltage is less than the predetermined voltage, and the threshold voltage exceeds the voltage at the one end of the second resistor if the voltage at the other end of the second resistor is the predetermined voltage and if the source (or the drain) and the gate of the first FET are short-circuited.

According to the above-described aspect, if the source (or the drain) and the gate of the first FET are short-circuited, the supply of power via the first FET and the second FET is stopped.

DETAILED DESCRIPTION OF PREFERRED EMBODIMENTS

Figure 1:
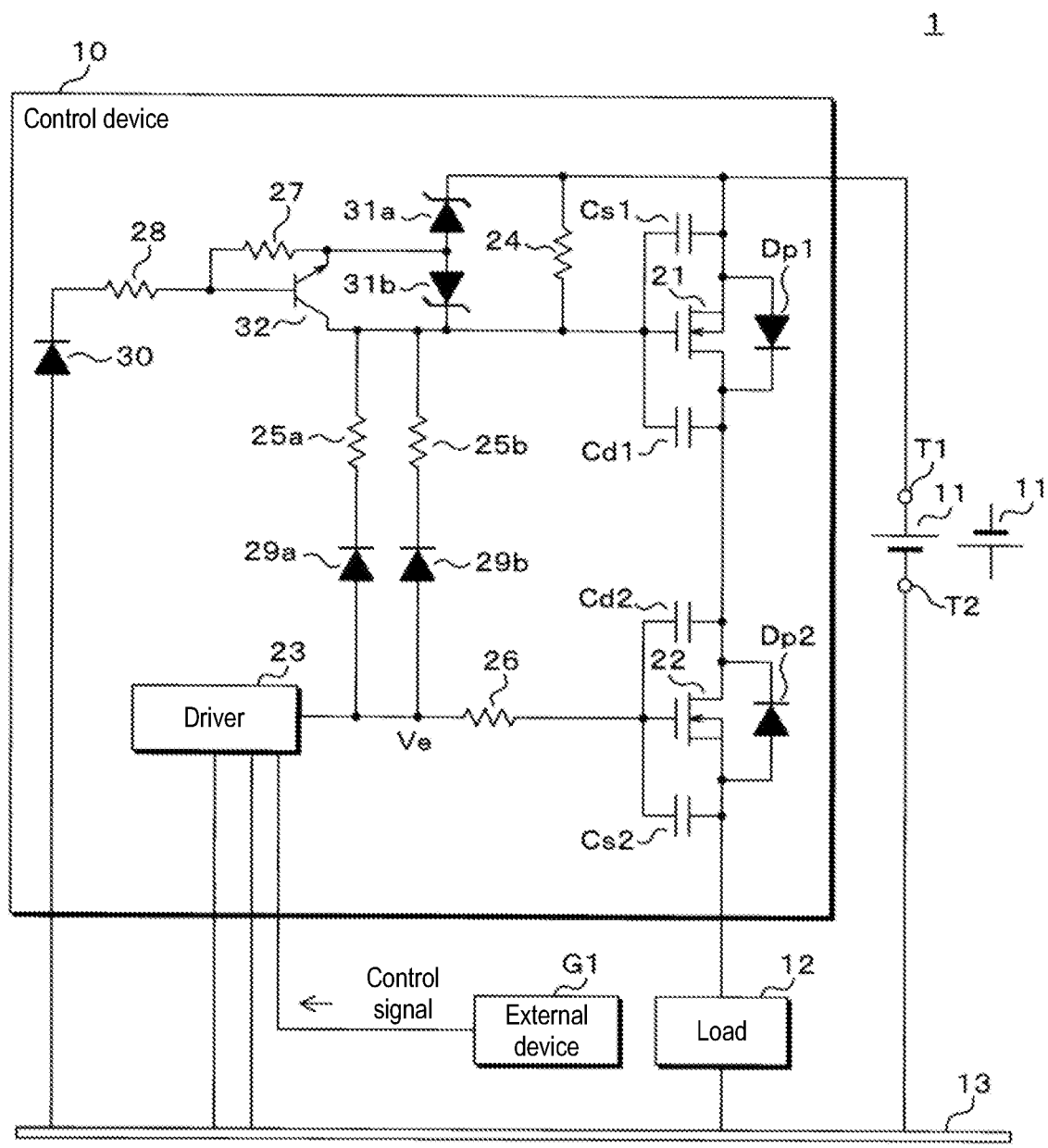
FIG. 1 is a circuit diagram of a power supply system according to Embodiment 1.

First, aspects of the present disclosure will be listed and described. At least a part of the aspects described below may be combined freely.

A control device according to an aspect of the present disclosure includes: an N-channel first FET; an N-channel second FET whose drain is connected to a drain (or a source) of the first FET; a first resistor that is connected between gates of the first FET and the second FET; a second resistor whose one end is connected to the gate of the second FET; a boost circuit that is connected to the other end of the second resistor, the boost circuit being configured to increase a voltage at the other end of the second resistor to a predetermined voltage that is higher than a voltage of the source (or the drain) of the first FET; a buck circuit (voltage-decreasing circuit) configured to decrease a voltage at the one end of the second resistor; and an instructing unit configured to instruct the boost circuit to increase the voltage at the other end of the second resistor, wherein the instructing unit is configured to instruct the buck circuit to decrease the voltage at the one end of the second resistor when the voltage at the one end of the second resistor is less than a threshold voltage if the instructing unit instructs the boost circuit to increase the voltage at the other end of the second resistor, the threshold voltage is less than the predetermined voltage, and the threshold voltage exceeds the voltage at the one end of the second resistor if the voltage at the other end of the second resistor is the predetermined voltage and if the source (or the drain) and the gate of the first FET are short-circuited.

In the above-described aspect, the voltage at the one end of the second resistor is less than the threshold voltage when the source (or the drain) of the first FET and the gate are short-circuited if the boost circuit is instructed to increase the voltage at the other end of the second resistor to the predetermined voltage. At this time, the buck circuit is instructed to decrease the voltage at the one end of the second resistor. Consequently, the gate voltage of the second FET is decreased, and the resistance value between the drain and the source of the second FET is increased. As a result, the supply of power via the first FET and the second FET is stopped.

A control device according to another aspect of the present disclosure includes a voltage maintaining member configured to maintain a voltage between the source and the gate of the first FET at less than or equal to a second predetermined voltage.

In the above-described aspect, the voltage between the gates of the first FET and the source is maintained at less than or equal to the second predetermined voltage by the function of the voltage maintaining member.

A control device according to another aspect of the present disclosure includes a switch, wherein the voltage maintaining member is a Zener diode, a cathode of the voltage maintaining member is connected to the source of the first FET, and an anode of the voltage maintaining member is connected to the gate of the first FET via the switch.

In the above-described aspect, if the switch is switched from off to on, the source and the gate of the first FET are short-circuited, and the gate voltage of the first FET is decreased. It is assumed that the drain of the first FET is connected to the drain of the second FET. In this case, the cathode of the parasitic diode of the first FET is connected to the cathode of the parasitic diode of the second FET. With this configuration, when the switch is switched from off to on, the resistance value between the drain and the source of the first FET is increased, thus preventing current from flowing from the source of the second FET toward the source of the first FET.

Since the anode of the Zener diode is connected to one end of the switch, it is possible to prevent current from flowing to the switch from the Zener diode.

A control device according to another aspect of the present disclosure includes a switch, wherein the voltage maintaining member is a Zener diode, a cathode of the voltage maintaining member is connected to the source of the first FET, and an anode of the voltage maintaining member is connected to the gate of the first FET via the switch.

In the above-described aspect, if the switch is switched from off to on, the source and the gate of the first FET are short-circuited, and the gate voltage of the first FET is decreased. It is assumed that the drain of the first FET is connected to the drain of the second FET. In this case, the cathode of the parasitic diode of the first FET is connected to the cathode of the parasitic diode of the second FET. With this configuration, when the switch is switched from off to on, the resistance value between the drain and the source of the first FET is increased, thus preventing current from flowing from the source of the second FET toward the source of the first FET.

Since the anode of the diode is connected to one end of the switch, it is possible to prevent current from flowing to the switch from the diode.

\ In a control device according to another aspect of the present disclosure, the instructing unit is configured to instruct the buck circuit to decrease the voltage at the one end of the second resistor when a time period during which the voltage at the one end of the second resistor is less than the threshold voltage is greater than or equal to a predetermined time period if the instructing unit instructs the boost circuit to increase the voltage at the other end of the second resistor.

In the above-described aspect, the buck circuit is instructed to decrease the voltage at the one end of the second resistor when the time period during which the voltage at the one end of the second resistor is less than the threshold voltage becomes greater than or equal to the predetermined time period, i.e., when there is a high possibility that a failure has occurred, if the boost circuit is instructed to increase the voltage at the other end of the second resistor to the predetermined voltage. Accordingly, the supply of power via the first FET and the second FET is stopped.

In a control device according to another aspect of the present disclosure, the number of the first resistors is 2 or more.

In the above-described aspect, even if the passage of current via one of the plurality of first resistors is stopped, the passage of current via the other first resistor is performed, and, therefore, the first FET and the second FET function appropriately.

Specific examples of a power supply system according to embodiments of the present disclosure will be described below with reference to the drawings. It should be note that the present disclosure is not limited to these examples, and is intended to include all modifications which fall within the scope of the claims and the meaning and scope of equivalents thereof.

Embodiment 1

FIG. 1 is a circuit diagram of a power supply system 1 according to Embodiment 1. The power supply system 1 can be suitably mounted to a vehicle, and includes a control device 10, a battery 11, a load 12, and a conductor 13. The control device 10 is connected to a positive electrode terminal T1 to which the positive electrode of the battery 11 is connected, and to one end of the load 12. A negative electrode terminal T2 to which the negative electrode of the battery 11 is connected, and the other end of the load 12 are connected to the conductor 13. The control device 10 is further connected to the conductor 13 and an external device G1. The conductor 13 may be the body of a vehicle, for example. The connection to the conductor 13 corresponds to so-called grounding.

When the positive electrode and the negative electrode of the battery 11 are connected to the positive electrode terminal T1 and the negative electrode terminal T2, respectively, the battery 11 is connected normally (the connection of the battery 11 is a normal connection). When the negative electrode and the positive electrode of the battery 11 are connected to the positive electrode terminal T1 and the negative electrode terminal T2, respectively, the battery 11 is connected in reverse.

The battery 11 supplies power to the load 12 via the control device 10 if the battery 11 is connected normally. At this time, current flows through the positive electrode terminal T1, the control device 10, the load 12, the conductor 13, and the negative electrode terminal T2 in this order. The load 12 is an electric device mounted to the vehicle. The load 12 is activated when power is supplied to the load 12 from the battery 11. The load 12 is deactivated when the supply of power to the load 12 from the battery 11 is stopped.

A control signal is input to the control device 10 from the external device G1. The control signal is composed of a high-level voltage and a low-level voltage.

The control device 10 electrically connects the positive electrode terminal T1 and the load 12 when the voltage of the control signal is switched from a low-level voltage to a high-level voltage if the battery 11 is connected normally. Consequently, power is supplied to the load 12 from the battery 11, thus activating the load 12.

The control device 10 interrupts the electrical connection between the positive electrode terminal T1 and the load 12 when the voltage of the control signal is switched from a high-level voltage to a low-level voltage if the battery 11 is connected normally. Consequently, the supply of power to the load 12 from the battery 11 is stopped, thus deactivating the load 12.

The control device 10 interrupts the electrical connection between the positive electrode terminal T1 and the load 12, regardless of the voltage of the control signal, if the battery 11 is connected in reverse. Therefore, if the battery 11 is connected in reverse, power will not be supplied to the load 12.

The control device 10 includes a first FET 21, a second FET 22, a driver 23, resistors 24, 25a, 25b, 26, 27, and 28, diodes 29a, 29b, and 30, Zener diodes 31a and 31b, and a switch 32. The first FET 21 and the second FET 22 are of the N-channel type. The switch 32 is an NPN bipolar transistor.

When the first FET 21 is manufactured, parasitic capacitors Cs1 and Cd1 and a parasitic diode Dp1 are formed. The parasitic capacitor Cs1 is connected to the source and the gate of the first FET 21. The parasitic capacitor Cd1 is connected between the drain and the gate of the first FET 21. The cathode and the anode of the parasitic diode Dp1 are connected to the drain and the source, respectively, of the first FET 21.

Likewise, when the second FET 22 is manufactured, parasitic capacitors Cs2 and Cd2 and a parasitic diode Dp2 are formed. The parasitic capacitor Cs2 is connected between the source and the gate of the second FET 22. The parasitic capacitor Cd2 is connected between the drain and the gate of the second FET 22. The cathode and the anode of the parasitic diode Dp2 are connected to the drain and the source, respectively, of the second FET 22.

The source of the first FET 21 is connected to the positive electrode terminal T1. The drain of the first FET 21 is connected to the drain of the second FET 22. The source of the second FET 22 is connected to one end of the load 12. The resistor 24 is connected between the source and the gate of the first FET 21. One end of each of the resistors 25a and 25b is connected to the gate of the first FET 21. The other ends of the resistors 25a and 25b are connected to the cathodes of the diodes 29a and 29b, respectively. The driver 23 and the anodes of the diodes 29a and 29b are connected to the gate of the second FET 22 via the resistor 26.

Accordingly, the resistors 25a and 25b are connected between the gate of the first FET 21 and the second FET 22. Each of the resistors 25a and 25b functions as a first resistor.

The driver 23 is separately connected to the conductor 13 and the external device G1. The cathode of the Zener diode 31a is further connected to the source of the first FET 21. The anode of the Zener diode 31b is connected to the anode of the Zener diode 31a. The cathode of the Zener diode 31b is connected to the gate of the first FET 21. The emitter of the switch 32 is further connected to the anode of the Zener diode 31a. The collector of the switch 32 is connected to the gate of the first FET 21. Accordingly, the anode of the Zener diode 31a is connected to the gate of the first FET 21 via the switch 32.

The resistor 27 is connected between the emitter and the base of the switch 32. One end of the resistor 28 is further connected to the base of the switch 32. The other end of the resistor 28 is connected to the cathode of the diode 30. The anode of the diode 30 is connected to the conductor 13.

For each of the first FET 21 and the second FET 22, the resistance value between the drain and the source is decreased when the gate voltage relative to the source potential is increased. Current flows through the positive electrode terminal T1, the first FET 21, the second FET 22, the load 12, the conductor 13, and the negative electrode terminal T2 in this order when the resistance value between the drain and the source of the first FET 21 and the resistance value between the drain and the source of the second FET 22 are small if the battery 11 is connected normally. At this time, the current is input from the positive electrode terminal T1 to the source of the first FET 21, and the current is output from the drain of the first FET 21. The current is input from the drain of the first FET 21 to the drain of the second FET 22. The current is output from the source of the second FET 22 to the load 12.

The external device G1 outputs a control signal to the driver 23. The driver 23 increases the voltage, relative to the potential of the conductor 13, at one end of the resistor 26 on the driver 23 side if the voltage of the control signal is switched from a low-level voltage to a high-level voltage. This voltage is applied to the gate of the first FET 21 via the diode 29a and the resistor 25a, or via the diode 29b and the resistor 25b, and is also applied to the gate of the second FET 22 via the resistor 26. In the following, the voltage at the one end of the resistor 26 on the driver 23 side will be referred to as an "output-end voltage". The output-end voltage is expressed as Ve.

In the following, it is assumed that the battery 11 is connected normally. If the battery 11 is connected normally, the switch 32 is off, as will be described below, and current will not flow between the collector and the emitter of the switch 32.

When the driver 23 has increased the output-end voltage Ve, current flows in the following manner: Current flows through the parasitic capacitors Cs1 and Cd1 of the first FET 21 via the diode 29a and the resistor 25a, or via the diode 29b and the resistor 25b. Current further flows through the parasitic capacitors Cs2 and Cd2 via the resistor 26. Consequently, the parasitic capacitors Cs1, Cd1, Cs2, and Cd2 are charged. When the parasitic capacitors Cs1, Cd1, Cs2, and Cd2 have been charged, the gate voltage relative to the source potential is increased in each of the first FET 21 and the second FET 22, and the resistance value between the drain and the source is decreased. As a result, the positive electrode terminal T1 and the load 12 are electrically connected, and the battery 11 supplies power to the load 12 via the first FET 21 and the second FET 22.

When the resistance value between the drain and the source is small in each of the first FET 21 and the second FET 22, the source voltages of the first FET 21 and the second FET 22 substantially match the output voltage of the battery 11. Accordingly, the output-end voltage Ve is higher than the output voltage of the battery 11.

The driver 23 decreases the output-end voltage Ve by causing the parasitic capacitors Cs2 and Cd2 to discharge if the voltage of the control signal is switched from a high-level voltage to a low-level voltage. At this time, current flows from one end of the second FET 22 on the gate side through the resistor 26 and the driver 23 in this order. While the parasitic capacitors Cs2 and Cd2 discharge, the parasitic capacitors Cs1 and Cd1 discharge. At this time, for each of the parasitic capacitors Cs1 and Cd1, current flows through the resistor 24 from one end of the first FET 21 on the gate side. When the parasitic capacitors Cs1, Cd1, Cs2, and Cd2 have discharged, the gate voltage relative to the source potential is decreased in the first FET 21 and the second FET 22, and the resistance value between the drain and the source is increased. As a result, the electrical connection between the positive electrode terminal T1 and the load 12 is interrupted, and the supply of power to the load 12 is stopped.

The diodes 29a and 29b prevent the battery 11 from applying a voltage to the gate of the second FET 22 via the resistors 24 and 26. If the diodes 29a and 29b were not present and the battery 11 would apply a voltage to the gate of the second FET 22, the value of the gate voltage relative to the source potential in the second FET 22 would become an inappropriate value.

In this case, the resistance value between the drain and the source of the second FET 22 would not be sufficiently large, and, therefore, current would flow through the parasitic diode Dp1 and the second FET 22 in this order. Furthermore, the resistance value between the drain and the source of the second FET 22 would not be sufficiently small, and, therefore, the amount of heat generated in the second FET 22 would be large, resulting in the possibility that the second FET 22 may fail. For each of the first FET 21 and the second FET 22, the phenomenon that the value of the gate voltage relative to the source potential becomes inappropriate is called "half on".

In each of the Zener diodes 31a and 31b, if the cathode voltage relative to the anode potential is less than the breakdown voltage, current will not flow from the cathode to the anode. If the cathode voltage relative to the anode potential is greater than or equal to the breakdown voltage, current flows from the cathode to the anode, and the voltage between the cathode and the anode is maintained at the breakdown voltage. The breakdown voltage of the Zener diodes 31a and 31b is a constant voltage.

For each of the Zener diodes 31a and 31b, if the voltage generated when current flows through the anode and the cathode in this order is ignored, the Zener diode 31a maintains the source voltage relative to the gate potential in the first FET 21 at less than or equal to the breakdown voltage. The Zener diode 31b maintains the gate voltage relative to the source potential in the first FET 21 at less than or equal to the breakdown voltage. The Zener diode 31a functions as a voltage maintaining member, and the breakdown voltage of the Zener diode 31a corresponds to a second predetermined voltage.

Note that the breakdown voltages of the Zener diodes 31a and 31b may be the same, or may be different from each other.

For the switch 32, if the base voltage relative to the emitter potential is greater than or equal to a constant positive voltage, current can flow between the collector and the emitter. At this time, the switch 32 is on. For the switch 32, if the base voltage relative to the emitter potential is less than the constant positive voltage, current will not flow via the collector and the emitter. At this time, the switch 32 is off.

If the battery 11 is connected normally, current will not flow through the resistor 27 owing to the function of the diode 30. At this time, the base voltage relative to the emitter potential in the switch 32 is zero V, which is less than the above-described constant voltage. Therefore, the switch 32 is off.

If the battery 11 is connected in reverse, current flows through the negative electrode terminal T2, the conductor 13, the diode 30, the resistors 28 and 27, the Zener diode 31a, and the positive electrode terminal T1 in this order. Consequently, a voltage drop occurs in the resistor 27, and, therefore, the base voltage relative to the emitter potential in the switch 32 is greater than or equal to the constant voltage, and the switch 32 is on.

If the switch 32 is switched from off to on, the source and the gate are short-circuited in the first FET 21, and the gate voltage relative to the source potential is decreased to substantially zero V, regardless of the output-end voltage Ve. Consequently, the resistance value between the drain and the source of the first FET 21 is increased to a sufficiently large value, thus preventing current from flowing from the source of the second FET 22 toward the source of the first FET 21.

The gate voltage relative to the source potential in the first FET 21 is increased as described above when the output-end voltage Ve has been increased if the switch 32 is off.

The Zener diode 31a prevents current from flowing through the resistor 27, the base of the switch 32, and the collector of the switch 32 in this order if the battery 11 is connected normally. For a bipolar transistor, current is not supposed to flow through the base and the collector in this order. Therefore, when current flows through the base and the collector in this order in the switch 32, there is the possibility that the switch 32 may fail. This failure is prevented by the function of the Zener diode 31a.

As described above, if the battery 11 is connected in reverse, the switch 32 is on, and the connection between the positive electrode terminal T1 and the load 12 is interrupted regardless of the output-end voltage Ve, i.e., the voltage of the control signal. If the battery 11 is connected normally, the driver 23 electrically connects the positive electrode terminal T1 to the load 12 or interrupts this connection, by adjusting the output-end voltage Ve.

Next, the configuration of the driver 23 will be described. The description of the driver 23 is based on the assumption that the battery 11 is connected normally.

Figure 2:
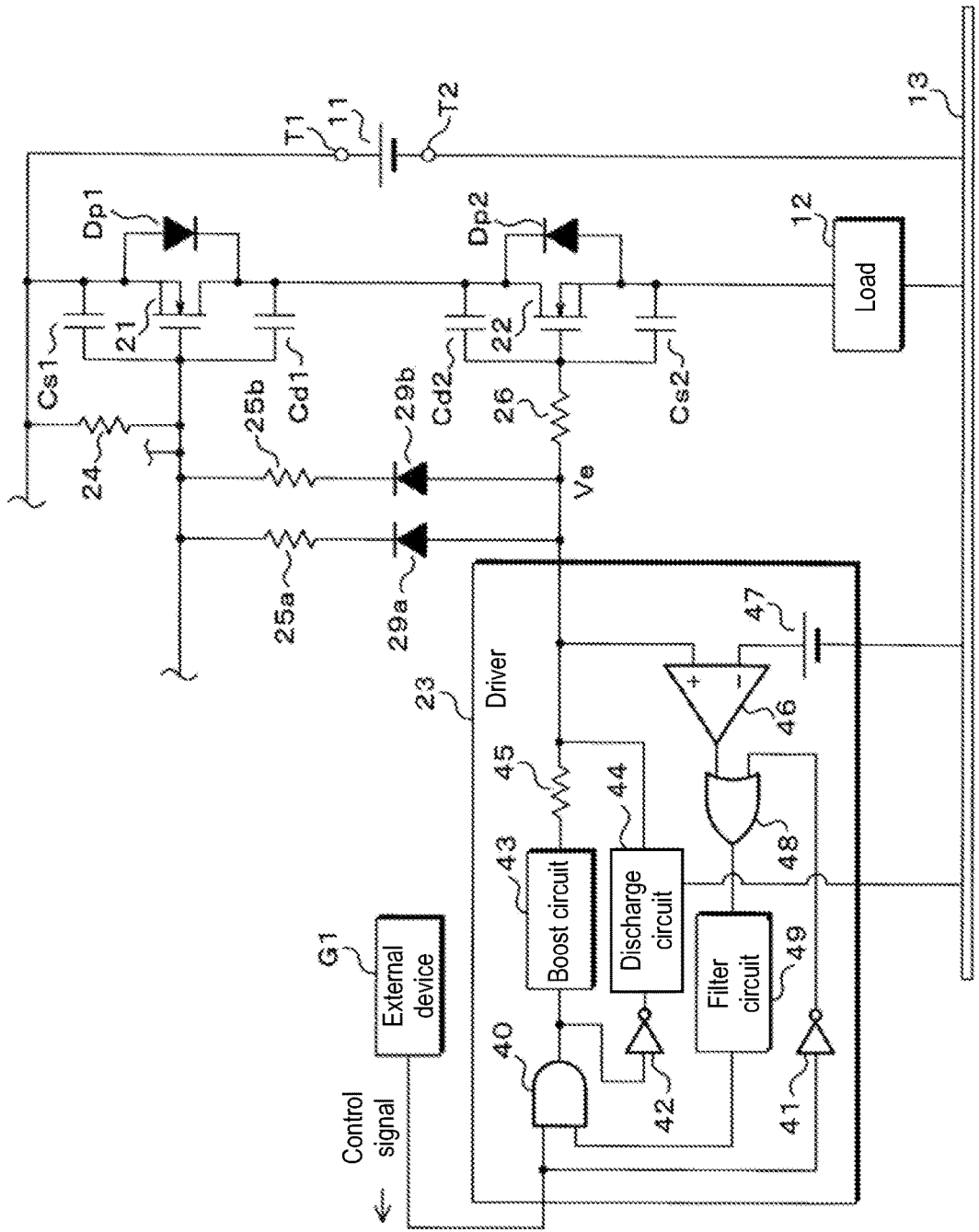
FIG. 2 is a circuit diagram of a driver.

FIG. 2 is a circuit diagram of the driver 23. The driver 23 includes an AND circuit 40, inverters 41 and 42, a boost circuit (voltage-increasing circuit) 43, a discharge circuit 44, a resistor 45, a comparator 46, a DC power supply 47, an OR circuit 48, and a filter circuit 49. Each of the AND circuit 40 and the OR circuit 48 has two input ends and one output end. Each of the inverters 41 and 42 has one input end and one output end. The comparator 46 has a positive end, a negative end, and an output end.

The external device G1 is connected to one of the input ends of the AND circuit 40 and the input end of the inverter 41. The output end of the AND circuit 40 is connected to the input end of the inverter 42 and the boost circuit 43. The output end of the inverter 42 is connected to the discharge circuit 44. The boost circuit 43 is further connected to one end of the resistor 45. The other end of the resistor 45 is connected to the gate of the second FET 22 via the resistor 26. The discharge circuit 44 is further connected to the conductor 13 and the other end of the resistor 45. The resistor 45 functions as a second resistor.

For the comparator 46, the positive end is connected to the other end of the resistor 45, the negative end is connected to the positive electrode of the DC power supply 47, and the output end is connected to one of the input ends of the OR circuit 48.

The negative electrode of the DC power supply 47 is connected to the conductor 13. The output end of the inverter 41 is connected to the other input end of the OR circuit 48. The output end of the OR circuit 48 is connected to the filter circuit 49. The filter circuit 49 is further connected to the other input end of the AND circuit 40.

Note that the boost circuit 43 is further connected to the conductor 13. The illustration of this connection has been omitted in FIG. 2.

The external device G1 outputs a control signal to the AND circuit 40. As described previously, the control signal has a high-level voltage or a low-level voltage. The filter circuit 49 outputs a high-level voltage or a low-level voltage to the AND circuit 40.

The AND circuit 40 outputs a high-level voltage to the inverter 42 and the boost circuit 43 when the control signal has a high-level voltage if the filter circuit 49 outputs a high-level voltage. The AND circuit 40 outputs a low-level voltage to the inverter 42 and the boost circuit 43 when the control signal has a low-level voltage in the same case. Accordingly, the AND circuit 40 outputs the voltage of the control signal if the filter circuit 49 outputs a high-level voltage. The AND circuit 40 outputs a low-level voltage to the inverter 42 and the boost circuit 43, regardless of the voltage of the control signal, if the filter circuit 49 outputs a low-level voltage If the voltage that has been input from the AND circuit 40 is switched from a low-level voltage to a high-level voltage, the boost circuit 43 increases the voltage, relative to the potential of the conductor 13, of the one end of the resistor 45 to a predetermined voltage that is higher than the voltage of the positive electrode terminal T1, i.e., the source of the first FET 21. Consequently, the output-end voltage Ve, which is the voltage at the other end of the resistor 45 is increased, and the resistance value between the drain and the source is decreased for each of the first FET 21 and the second FET 22. If the voltage that has been input from the AND circuit 40 is switched from a high-level voltage to a low-level voltage, the boost circuit 43 stops the application of the voltage to the one end of the resistor 45. At this time, no current flows through the resistor 45, and, therefore, the voltages of both ends of the resistor 45 substantially match the output-end voltage Ve.

For example, the boost circuit 43 increases the voltage of the positive electrode terminal T1 relative to the potential of the conductor 13, and applies the increased voltage to the one end of the resistor 45. Consequently, the voltage at the one end of the resistor 45 is increased. With a configuration in which the voltage of the positive electrode terminal T1 is increased, the boost circuit 43 stops the application of the voltage to the one end of the resistor 45 by stopping to increase the voltage.

As described above, the AND circuit 40 instructs the boost circuit 43 to increase the voltage at the one end of the resistor 45 by outputting a high-level voltage, and instructs the boost circuit 43 to stop applying the voltage to the one end of the resistor 45 by outputting a low-level voltage. The AND circuit 40 functions as an instructing unit.

If a high-level voltage has been input from the AND circuit 40, the inverter 42 outputs a low-level voltage to the discharge circuit 44. If a low-level voltage has been input from the AND circuit 40, the inverter 42 outputs a high-level voltage to the discharge circuit 44.

If the voltage that has been input from the inverter 42 is switched from a low-level voltage to a high-level voltage, the discharge circuit 44 electrically connects the one end of the resistor 26 on the resistor 45 side to the conductor 13. Consequently, the parasitic capacitors Cs2 and Cd2 of the second FET 22 discharge, and the output-end voltage Ve is decreased. At this time, current flows through the resistor 26, the discharge circuit 44, and the conductor 13 in this order from one end of each of the parasitic capacitors Cs2 and Cd2 on the resistor 26 side. If the voltage that has been input from the inverter 42 is switched from a high-level voltage to a low-level voltage, the discharge circuit 44 interrupts the electrical connection between the conductor 13 and the resistor 26. Consequently, the parasitic capacitors Cs2 and Cd2 stop discharging.

For example, the discharge circuit 44 includes a discharge switch that is connected between the conductor 13 and the resistor 26. In this case, the discharge circuit 44 electrically connects the conductor 13 and the resistor 26 by switching on the discharge switch, and interrupts the electrical connection between the conductor 13 and the resistor 26 by switching off the discharge switch.

As described above, the AND circuit 40 instructs the discharge circuit 44 to decrease the output-end voltage Ve by outputting a low-level voltage, and instructs the discharge circuit 44 to stop decreasing the output-end voltage Ve by outputting a high-level voltage. The discharge circuit 44 functions as a buck circuit.

The boost circuit 43 increases the voltage of one end of the resistor 45 in a state in which the discharge circuit 44 interrupts the electrical connection between the conductor 13 and the resistor 26. The discharge circuit 44 electrically connects the conductor 13 and the resistor 26 in a state in which the boost circuit 43 decreases the voltage at the one end of the resistor 45. In other words, the AND circuit 40 instructs the boost circuit 43 to increase the voltage at the one end of the resistor 45 in a state in which the AND circuit 40 instructs the discharge circuit 44 to stop decreasing the output-end voltage Ve, and instructs the discharge circuit 44 to decrease the output-end voltage Ve in a state in which the AND circuit 40 instructs the boost circuit 43 to stop applying the voltage to the one end of the resistor 45.

The external device G1 also outputs a control signal to the inverter 41. If the control signal has a high-level voltage, the inverter 41 outputs a low-level voltage to the OR circuit 48. If the control signal has a low-level voltage, the inverter 41 outputs a high-level voltage to the OR circuit 48.

If the output-end voltage Ve is greater than or equal to the voltage across the DC power supply 47, the comparator 46 outputs a high-level voltage to the OR circuit 48. If the output-end voltage Ve is less than the voltage across the DC power supply 47, the comparator 46 outputs a low-level voltage to the OR circuit 48. The voltage across the DC power supply 47 is substantially constant.

In the following, the voltage across the DC power supply 47 will be referred to as "threshold voltage". The threshold voltage is expressed as Vth (see FIGS. 3 to 5).

If the inverter 41 or the comparator 46 outputs a high-level voltage, the OR circuit 48 outputs a high-level voltage to the filter circuit 49. If both of the inverter 41 and the comparator 46 output a low-level voltage, the OR circuit 48 outputs a low-level voltage to the filter circuit 49.

In other words, if the control signal has a low-level voltage, or if the output-end voltage Ve is greater than or equal to a threshold voltage Vth, the OR circuit 48 outputs a high-level voltage to the filter circuit 49. If the output-end voltage Ve is less than the threshold voltage Vth despite the control signal having a high-level voltage, the OR circuit 48 outputs a low-level voltage to the filter circuit 49.

If the OR circuit 48 outputs a high-level voltage, or if the time period during which the OR circuit 48 continues to output a low-level voltage is less than a predetermined time period, the filter circuit 49 outputs a high-level voltage to the AND circuit 40. If the OR circuit 48 continues to output a low-level voltage for the predetermined time period, the filter circuit 49 outputs a low-level voltage to the AND circuit 40.

Accordingly, if the time period during which the output-end voltage Ve is less than the threshold voltage Vth has continued for the predetermined time period despite the control signal having a high-level voltage, the filter circuit 49 outputs a low-level voltage to the AND circuit 40.

As described above, if the filter circuit 49 outputs a low-level voltage to the AND circuit 40, the AND circuit 40 outputs a low-level voltage regardless of the voltage of the control signal. In this case, the boost circuit 43 stops the application of the voltage to the one end of the resistor 45, and the discharge circuit 44 causes the parasitic capacitors Cs2 and Cd2 to discharge. As described above, the parasitic capacitors Cs1 and Cd1 discharge while the parasitic capacitors Cs2 and Cd2 discharge. By the discharge of the parasitic capacitors Cs1, Cd1, Cs2, and Cd2, the gate voltages of the first FET 21 and the second FET 22 are decreased, and the electrical connection between the positive electrode terminal T1 and the load 12 is interrupted.

Figure 3:
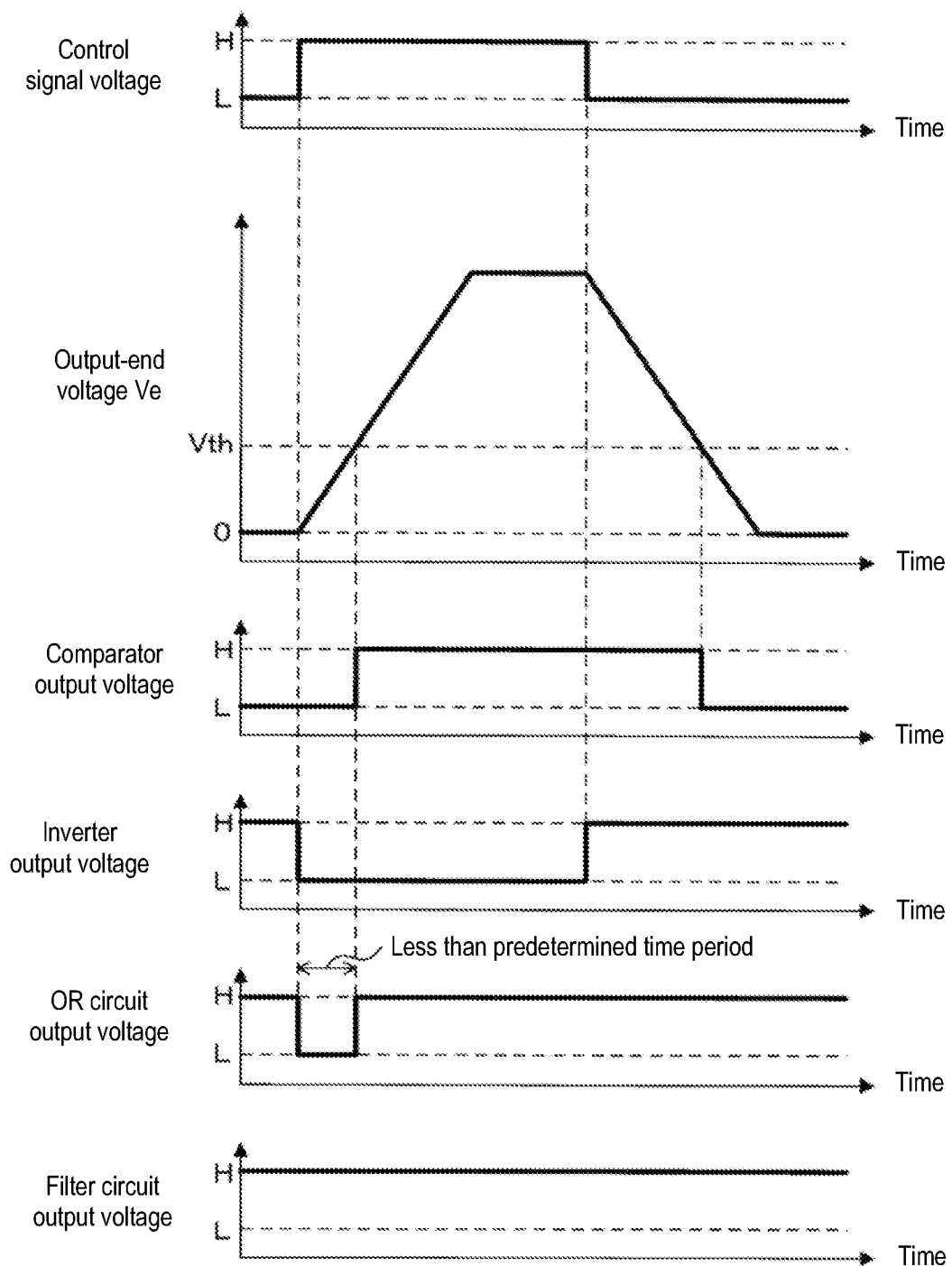
FIG. 3 is a timing chart showing a first example of operations of the driver.

FIG. 3 is a timing chart showing a first example of operations of the driver 23. Here, the operations of the driver 23 when no failure has occurred will be described. FIG. 3 shows the run of the voltage of the control signal, the output-end voltage Ve, and output voltages that are output by the comparator 46, the inverter 41, the OR circuit 48, and the filter circuit 49. The horizontal axis represents time. "H" indicates a high-level voltage, and "L" indicates a low-level voltage.

If the control signal has a low-level voltage, the AND circuit 40 outputs a low-level voltage, and the discharge circuit 44 causes the parasitic capacitors Cs2 and Cd2 to discharge in a state in which the boost circuit 43 stops the application of the voltage to the one end of the resistor 45. Therefore, the output-end voltage Ve is zero V, which is less than the threshold voltage Vth. Accordingly, the comparator 46 outputs a low-level voltage.

If the control signal has a low-level voltage, the inverter 41, the OR circuit 48, and the filter circuit 49 output a high-level voltage.

If the output-end voltage Ve is zero V, the gate voltage is low for each of the first FET 21 and the second FET 22, and the electrical connection between the positive electrode terminal T1 and the load 12 is interrupted.

If the voltage of the control signal is switched from a low-level voltage to a high-level voltage, the inverter 41 switches the voltage that is output to the OR circuit 48 to a low-level voltage. Furthermore, the AND circuit 40 switches the voltage that is output to the inverter 42 and the boost circuit 43 to a high-level voltage, and, therefore, the discharge circuit 44 interrupts the electrical connection between the conductor 13 and the resistor 26, and the boost circuit 43 increases the voltage at the one end of the resistor 45 to the predetermined voltage. Consequently, the output-end voltage Ve is also increased, and the parasitic capacitors Cs1, Cd1, Cs2, and Cd2 are charged, thus increasing the gate voltages of the first FET 21 and the second FET 22.

At the point in time when the voltage of the control signal is switched from a low-level voltage to a high-level voltage, the output-end voltage Ve is less than the threshold voltage Vth. Therefore, if the voltage of the control signal is switched from a low-level voltage to a high-level voltage, the OR circuit 48 switches the voltage that is output to the filter circuit 49 to a low-level voltage.

If the output-end voltage Ve becomes greater than or equal to the threshold voltage Vth, the voltage that is output by the comparator 46 to the OR circuit 48 is switched to a high-level voltage. Accordingly, the OR circuit 48 switches the voltage that is output to the filter circuit 49 to a high-level voltage. If no failure has occurred, the time period during which the output-end voltage Ve reaches the threshold voltage Vth from zero V is less than the predetermined time period previously discussed in the description of the filter circuit 49. Therefore, the filter circuit 49 continues to output a high-level voltage to the AND circuit 40 for the time period during which the output-end voltage Ve reaches the threshold voltage Vth from zero V.

After the voltage at the one end of the resistor 45 has reached the predetermined voltage, the boost circuit 43 maintains the voltage at the one end of the resistor 45 at the predetermined voltage. While the voltage of one end of the resistor 45 is maintained at the predetermined voltage, the output-end voltage Ve is also constant. At this time, the gate voltage relative to the source potential is high for each of the first FET 21 and the second FET 22, and power is supplied to the load 12 from the battery 11, thus activating the load 12.

If the voltage of the control signal is switched from a high-level voltage to a low-level voltage, the AND circuit 40 outputs a low-level voltage as described previously. Thus, the boost circuit 43 stops the application of the voltage to the one end of the resistor 45, and the discharge circuit 44 electrically connects the resistor 26 and the conductor 13, thus causing the parasitic capacitors Cs2 and Cd2 to discharge. At this time, the parasitic capacitors Cs1 and Cd1 discharge via the resistor 24 as described previously. By the discharge of the parasitic capacitors Cs2 and Cd2, the output-end voltage Ve is decreased.

If the voltage of the control signal is switched from a high-level voltage to a low-level voltage, the voltage that is output by the inverter 41 to the OR circuit 48 is switched to a high-level voltage.

If the output-end voltage Ve becomes less than the threshold voltage Vth, the comparator 46 switches the voltage that is output to the OR circuit 48 to a low-level voltage. At this point, the inverter 41 outputs a high-level voltage, and, therefore, the OR circuit 48 maintains the voltage that is output to the filter circuit 49 at a high-level voltage, without switching the voltage to a low-level voltage. While the OR circuit 48 outputs a high-level voltage, the filter circuit 49 outputs a high-level voltage.

After the output-end voltage Ve has reached zero V, zero V is maintained until the voltage of the control signal is switched to a high-level voltage.

By the discharge of the parasitic capacitors Cs1, Cd1, Cs2, and Cd2, the gate voltage relative to the source potential is decreased in each of the first FET 21 and the second FET 22. Consequently, the resistance value between the drain and the source is increased in each of the first FET 21 and the second FET 22, and the electrical connection between the positive electrode terminal T1 and the load 12 is interrupted, thus deactivating the load 12.

As described above, if no failure has occurred, the filter circuit 49 continues to output a high-level voltage to the AND circuit 40, and the AND circuit 40 will not switch the voltage that is output to the inverter 42 and the boost circuit 43 to a low-level voltage. Accordingly, the electrical connection between the positive electrode terminal T1 and the load 12 will not be forcibly interrupted regardless of the voltage of the control signal.

The sources of the first FET 21 and the second FET 22 are electrically connected if the control signal has a high-level voltage, and the electrical connection between the sources of the first FET 21 and the second FET 22 is interrupted if the control signal has a low-level voltage.

Accordingly, the control signal having a high-level voltage corresponds to the control signal instructing electrical connection between the sources of the first FET 21 and the second FET 22. The control signal having a low-level voltage corresponds to the control signal instructing interruption of electrical connection between the sources of the first FET 21 and the second FET 22.

Figure 4:
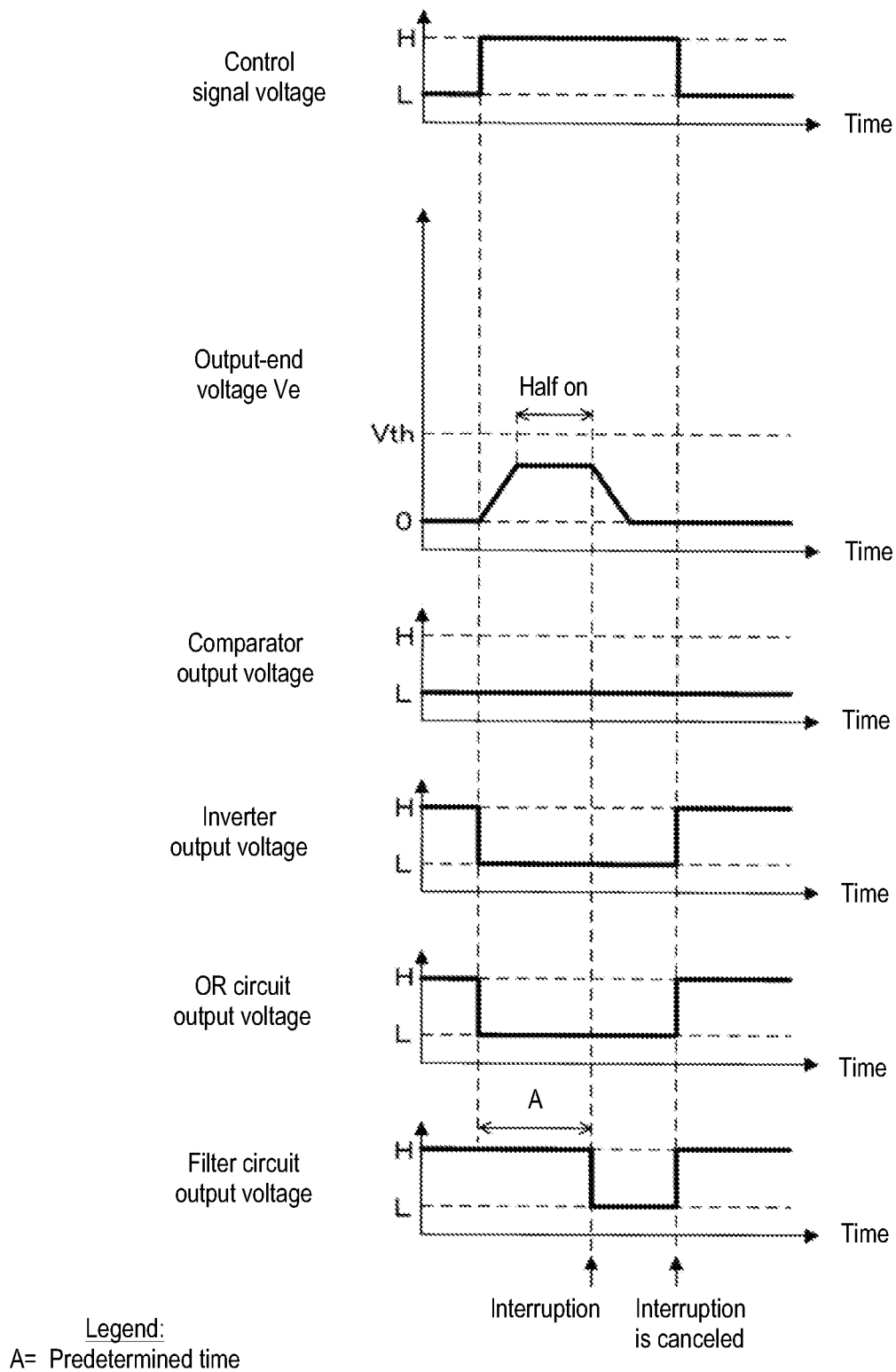
FIG. 4 is a timing chart showing a second example of operations of the driver.

FIG. 4 is a timing chart showing a second example of operations of the driver 23. Here, a description is given of the operations of the driver 23 in the case where, due to the occurrence of a failure in the boost circuit 43, the boost circuit 43 is unable to increase the voltage at the one end of the resistor 45 to the predetermined voltage, and the output-end voltage Ve does not become greater than or equal to the threshold voltage Vth. FIG. 4 also shows the run of the voltage of the control signal, the output-end voltage Ve, and output voltages that are output by the comparator 46, the inverter 41, the OR circuit 48, and the filter circuit 49. The horizontal axis represents time. "H" indicates a high-level voltage, and "L" indicates a low-level voltage.

As described previously, if the control signal has a low-level voltage, the AND circuit 40 outputs a low-level voltage, and the output-end voltage Ve is zero V, which is less than the threshold voltage Vth. Accordingly, the comparator 46 outputs a low-level voltage. If the control signal has a low-level voltage, the inverter 41, the OR circuit 48, and the filter circuit 49 output a high-level voltage. If the output-end voltage Ve is zero V, the electrical connection between the positive electrode terminal T1 and the load 12 is interrupted.

If the voltage of the control signal is switched from a low-level voltage to a high-level voltage, the inverter 41 switches the voltage that is output to the OR circuit 48 to a low-level voltage. Furthermore, the AND circuit 40 switches the voltage that is output to the inverter 42 and the boost circuit 43 to a high-level voltage, and, therefore, the discharge circuit 44 interrupts the electrical connection between the conductor 13 and the resistor 26, and the boost circuit 43 increases the voltage at the one end of the resistor 45. Consequently, the output-end voltage Ve is also increased, and the parasitic capacitors Cs1, Cd1, Cs2, and Cd2 are charged, thus increasing the gate voltage relative to the source potential for each of the first FET 21 and the second FET 22.

As described previously, the boost circuit 43 is unable to increase the voltage at the one end of the resistor 45 to the predetermined voltage, and the output-end voltage Ve does not become greater than or equal to the threshold voltage Vth. Accordingly, the output-end voltage Ve is maintained at less than the threshold voltage Vth. Here, as shown in FIG. 4, if the output-end voltage Ve has an inappropriate value, the first FET 21 and the second FET 22 may become half on. In this case, as described previously, current flows via the first FET 21 and the second FET 22, and the temperatures of the first FET 21 and the second FET are increased, resulting in the possibility that the first FET 21 and the second FET 22 may fail.

At the point in time when the voltage of the control signal is switched from a low-level voltage to a high-level voltage, the output-end voltage Ve is less than the threshold voltage Vth. Therefore, if the voltage of the control signal is switched from a low-level voltage to a high-level voltage, the OR circuit 48 switches the voltage that is output to the filter circuit 49 to a low-level voltage. Furthermore, the output-end voltage Ve will not be greater than or equal to the threshold voltage Vth, and, therefore, the comparator 46 continues to output a low-level voltage. As a result, the filter circuit 49 switches the voltage that is output to the AND circuit 40 to a low-level voltage if the time period during which the OR circuit 48 outputs a low-level voltage, i.e., the time period during which the output-end voltage Ve is less than the threshold voltage Vth despite the control signal having a high-level voltage, becomes greater than or equal to the predetermined time period.

At this time, the AND circuit 40 switches the voltage that is output to the inverter 42 and the boost circuit 43 to a low-level voltage, regardless of the voltage of the control signal. Thus, the boost circuit 43 stops the application of the voltage to the one end of the resistor 45, and the discharge circuit 44 electrically connects the resistor 26 and the conductor 13, thus causing the parasitic capacitors Cs2 and Cd2 to discharge. As a result, the output-end voltage Ve is decreased to zero V. While the parasitic capacitors Cs2 and Cd2 discharge, the parasitic capacitors Cs1 and Cd1 discharge via the resistor 24 as described previously. By the discharge of the parasitic capacitors Cs1, Cd1, Cs2, and Cd2, the electrical connection between the positive electrode terminal T1 and the load 12 is forcibly interrupted, thus deactivating the load 12.

Thereafter, if the voltage of the control signal is switched from a high-level voltage to a low-level voltage, the inverter 41 switches the voltage that is output to the OR circuit 48 to a high-level voltage, and the OR circuit 48 switches the voltage that is output to the filter circuit 49 to a high-level voltage. Thus, the filter circuit 49 switches the voltage that is output to the AND circuit 40 to a high-level voltage. As a result, the AND circuit 40 outputs the voltage of the control signal, and the forcible interruption is cancelled.

Note that if a failure has occurred in a state in which the boost circuit 43 maintains the voltage of one end of the resistor 45 at the predetermined voltage, and the voltage at the one end of the resistor 45 has been decreased from the predetermined voltage, the voltage that is output by the OR circuit 48 to the filter circuit 49 is switched to a low-level voltage when the output-end voltage Ve becomes less than the threshold voltage Vth. Then, if the time period during which the OR circuit 48 outputs a low-level voltage becomes greater than or equal to the predetermined time period, the output-end voltage Ve is decreased to zero V, thus forcibly interrupting the electrical connection between the positive electrode terminal T1 and the load 12. If the voltage of the control signal is switched to a low-level voltage, the forcible interruption is cancelled as described previously.

Figure 5:
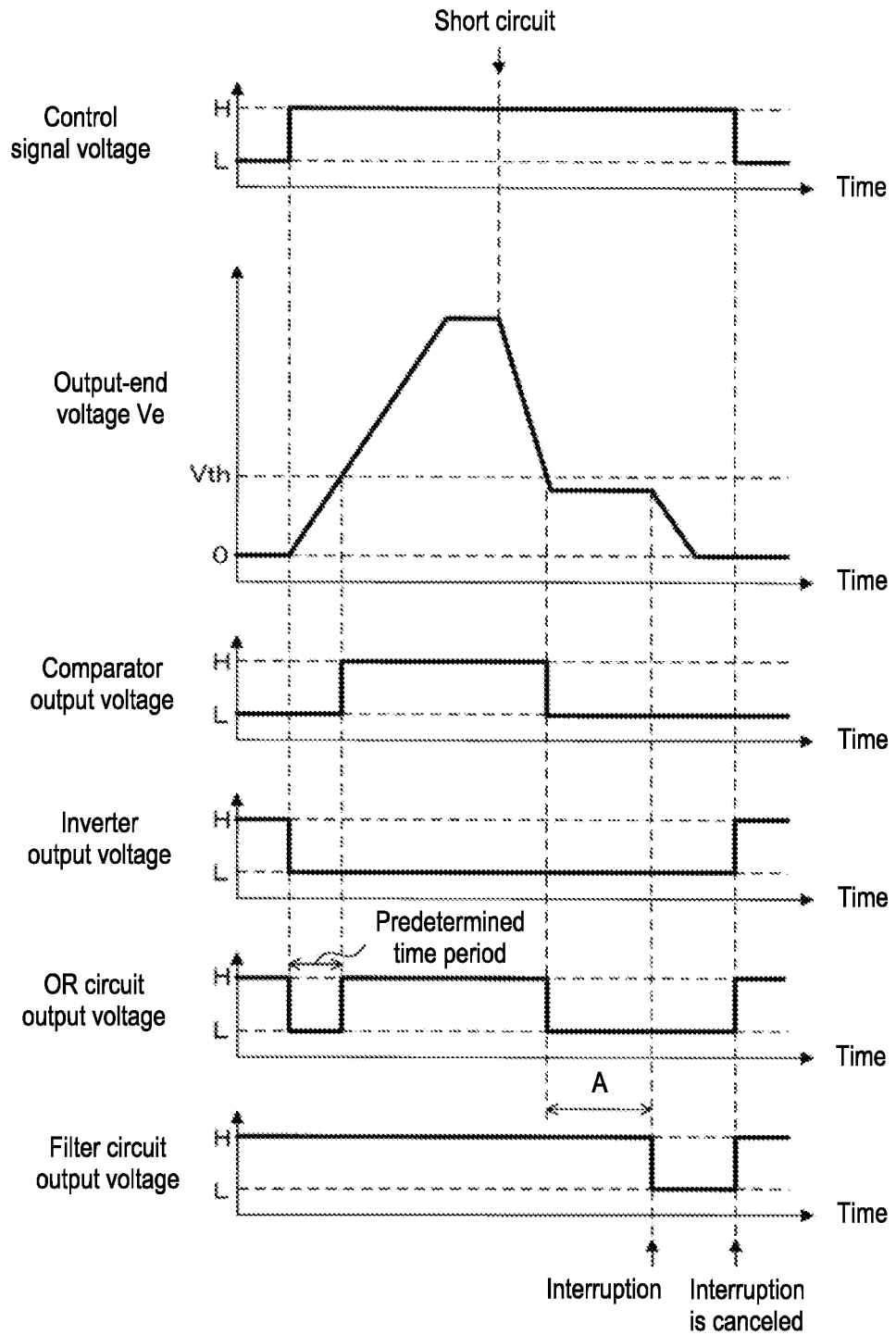
FIG. 5 is a timing chart showing a third example of operations of the driver.

FIG. 5 is a timing chart showing a third example of operations of the driver 23. Here, a description is given of the operations of the driver 23 in the case where the source and the gate of the first FET 21 are short-circuited in a state in which the boost circuit 43 maintains the voltage at the one end of the resistor 45 at the predetermined voltage. FIG. 5 also shows the run of the voltage of the control signal, the output-end voltage Ve, and output voltages that are output by the comparator 46, the inverter 41, the OR circuit 48, and the filter circuit 49. The horizontal axis represents time. "H" indicates a high-level voltage, and "L" indicates a low-level voltage.

As described previously, if the control signal has a low-level voltage, the AND circuit 40 outputs a low-level voltage, and the output-end voltage Ve is zero V, which is less than the threshold voltage Vth. Accordingly, the comparator 46 outputs a low-level voltage. If the control signal has a low-level voltage, the inverter 41, the OR circuit 48, and the filter circuit 49 output a high-level voltage. If the output-end voltage Ve is zero V, the electrical connection between the positive electrode terminal T1 and the load 12 is interrupted.

As described previously, if the voltage of the control signal is switched from a low-level voltage to a high-level voltage, the inverter 41 switches the voltage that is output to the OR circuit 48 to a low-level voltage. Furthermore, the voltage that is output by the AND circuit 40 is switched to a high-level voltage, and, therefore, the discharge circuit 44 interrupts the electrical connection between the conductor 13 and the resistor 26, and the boost circuit 43 increases the voltage at the one end of the resistor 45 to the predetermined voltage. Consequently, the output-end voltage Ve is increased, and the gate voltage relative to the source potential is increased for each of the first FET 21 and the second FET 22.

If the voltage of the control signal is switched from a low-level voltage to a high-level voltage, the OR circuit 48 switches the voltage that is output to the filter circuit 49 to a low-level voltage. The output-end voltage Ve becomes greater than or equal to the threshold voltage Vth before a predetermined time period passes since the voltage of the control signal has been switched to a high-level voltage, and the OR circuit 48 switches the voltage that is output to the filter circuit 49 to a high-level voltage. The filter circuit 49 continues to output a high-level voltage.

After the voltage at the one end of the resistor 45 has reached the predetermined voltage, the boost circuit 43 maintains the voltage at the one end of the resistor 45 at the predetermined voltage. While the voltage at the one end of the resistor 45 is maintained at the predetermined voltage, the output-end voltage Ve is also constant. At this time, the gate voltage relative to the source potential is high for each of the first FET 21 and the second FET 22, and power is supplied to the load 12 from the battery 11, thus activating the load 12.

If the source and the gate of the first FET 21 are short-circuited, the output-end voltage Ve is decreased because of a voltage division ratio as will be described below. Here, the threshold voltage Vth is set to a voltage that is less than the predetermined voltage and exceeds the output-end voltage Ve that has been decreased by short-circuiting. Therefore, if the source and the gate of the first FET 21 are short-circuited, the output-end voltage Ve is less than the threshold voltage Vth.

If the output-end voltage Ve becomes less than the threshold voltage Vth, the comparator 46 switches the voltage that is output to the OR circuit 48 to a low-level voltage in a state in which the inverter 41 outputs a low-level voltage. Thus, the OR circuit 48 switches the voltage that is output to the filter circuit 49 to a low-level voltage.

If the time period during which the OR circuit 48 outputs a low-level voltage in a state in which the AND circuit 40 outputs a high-level voltage, i.e., the time period during which the output-end voltage Ve is less than the threshold voltage Vth despite the control signal having a high-level voltage, becomes greater than or equal to a predetermined time period, the filter circuit 49 switches the voltage that is output to the AND circuit 40 to a low-level voltage. At this time, the AND circuit 40 switches the voltage that is output to the inverter 42 and the boost circuit 43 to a low-level voltage, regardless of the voltage of the control signal. Thus, the boost circuit 43 stops the application of the voltage to the one end of the resistor 45, and the discharge circuit 44 electrically connects the resistor 26 and the conductor 13, thus causing the parasitic capacitors Cs2 and Cd2 to discharge. As a result, the output-end voltage Ve is decreased to zero V. While the parasitic capacitors Cs2 and Cd2 discharge, the parasitic capacitors Cs1 and Cd1 discharge via the resistor 24 as described previously. By the discharge of the parasitic capacitors Cs1, Cd1, Cs2, and Cd2, the electrical connection between the positive electrode terminal T1 and the load 12 is forcibly interrupted, thus deactivating the load 12.

If the voltage of the control signal is switched to a low-level voltage after the discharge circuit 44 has electrically connected the resistor 26 and the conductor 13, the forcible interruption is cancelled as described previously.

Note that if the voltage of the control signal is switched to a high-level voltage in a state in which the source and the gate of the first FET 21 are short-circuited, the output-end voltage Ve will not reach the threshold voltage Vth. In this case, as has been shown in FIG. 4, the filter circuit 49 switches the voltage that is output to the AND circuit 40 to a high-level voltage when the predetermined time period passes since the voltage of the control signal has been switched to a high-level voltage, thus forcibly interrupting the electrical connection between positive electrode terminal T1 and the conductor 13. If the voltage of the control signal is switched to a low-level voltage, the forcible interruption is cancelled as described previously.

Next, a description will be given of the reason that the output-end voltage Ve is decreased if the source and the gate of the first FET 21 are short-circuited in a state in which the boost circuit 43 maintains the voltage of one end of the resistor 45 at the predetermined voltage.

In the following, the voltage across the battery 11 will be referred to as a "battery voltage". The predetermined voltage and the battery voltage are expressed as Vs and Vb, respectively. In addition, a voltage drop that occurs when current flows in the forward direction is ignored for each of the diodes 29a and 29b. Furthermore, the resistance values of the resistors 24 and 45 are expressed as r24 and r45, respectively, and the combined resistance value of the resistors 25a and 25b connected in parallel is expressed as r25.

Figure 6:
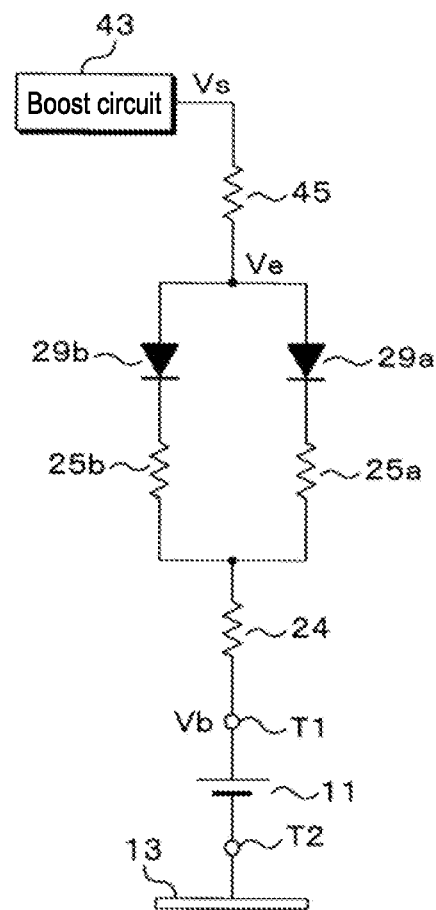
FIG. 6 is a circuit diagram between a boost circuit and a conductor in the case where short circuit has not occurred.

FIG. 6 is a circuit diagram between the boost circuit 43 and the conductor 13 in the case where short circuit has not occurred. If the source and the gate of the first FET 21 are short-circuited, the output-end voltage Ve is a voltage obtained by dividing the voltages of the resistor 45 and a combined resistor including the resistors 24, 25a, and 25b. The output-end voltage Ve (hereinafter referred to as a "non-short circuit voltage Ve1") in the case where the voltage at the one end of the resistor 45 is the predetermined voltage Vs, and the source and the gate of the first FET 21 are not short-circuited can be expressed by the following expression (1) ("·" denotes the product):

$$Ve1 = (Vs - Vb) \cdot ((r24 + r25)/(r24 + r25 + r45)) + Vb \quad (1)$$

The predetermined voltage Vs is higher than the battery voltage Vb. Accordingly, the non-short circuit voltage Ve1 is a positive voltage. The predetermined voltage Vs may be 25 V, for example. The battery voltage Vb may be 12 V, for example. The resistance value r24 is larger than the resistance value of each of the resistors 25a and 25b. Therefore, the resistance value r24 is larger than the combined resistance value r25 of the resistors 25a and 25b. Accordingly, the non-short circuit voltage Ve1 is relatively high, and may be 18 V, for example.

Figure 7:
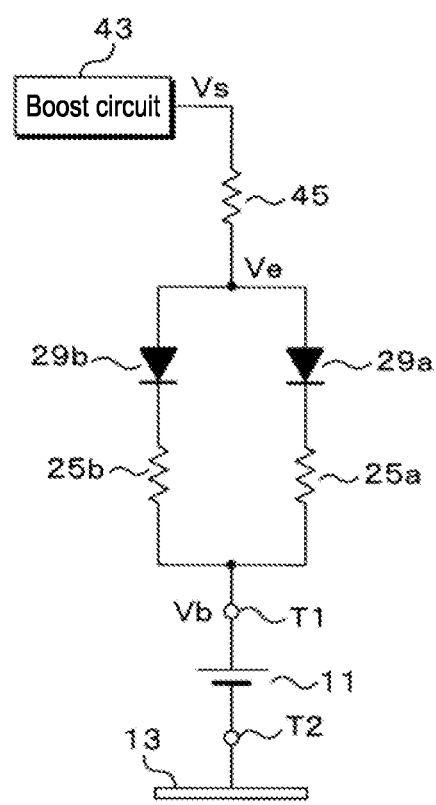
FIG. 7 is a circuit diagram between the boost circuit and the conductor in the case where short circuit has occurred.

FIG. 7 is a circuit diagram between the boost circuit 43 and the conductor 13 in the case where short circuit has occurred. If the source and the gate of the first FET 21 are short-circuited, the output-end voltage Ve is a voltage obtained by dividing the voltages of the resistor 45 and a combined resistor including the resistors 25a and 25b. The output-end voltage Ve (hereinafter referred to as a "short circuit voltage Ve2") in the case where the voltage at the one end of the resistor 45 is the predetermined voltage Vs, and the source and the gate of the first FET 21 are short-circuited can be expressed by the following expression (2):

$$Ve2 = (Vs - Vb) \cdot (r25/(r25 + r45)) + Vb \quad (2)$$

The expression (2) can be derived by assigning zero to r24 in the expression (1). As described previously, the predetermined voltage Vs is higher than the battery voltage Vb, and, therefore, the short circuit voltage Ve2 is also a positive voltage.

A difference value is derived by subtracting the short circuit voltage Ve2 from the non-short circuit voltage Ve1. The difference value can be expressed by (Vs−Vb)·r24·r45/((r25+r45)·(r24+r25+r45)). Here, the predetermined voltage Vs is higher than the battery voltage Vb, and each of the resistance values r24 and r45 and the combined resistance value r25 is a positive value. Therefore, the difference value is a positive value. As a result, the non-short circuit voltage Ve1 is higher than the short circuit voltage Ve2.

From the foregoing, it can be seen that the output-end voltage Ve is decreased if the source and the gate of the first FET 21 are short-circuited. The threshold voltage Vth is set to a voltage that is less than or equal to the non-short circuit voltage Ve1 and exceeds the short circuit voltage Ve2. The non-short circuit voltage Ve1 is less than the predetermined voltage Vs.

As described above, in the control device 10, the output-end voltage Ve is less than the threshold voltage Vth when the source and the gate of the first FET 21 are short-circuited if the AND circuit 40 instructs the boost circuit 43 to increase the voltage at the one end of the resistor 45 to the predetermined voltage Vs by outputting a high-level voltage. At this time, the AND circuit 40 outputs a low-level voltage, the boost circuit 43 stops the application of the voltage to one end of the resistor 45, and the discharge circuit 44 decreases the voltage at the one end of the resistor 45. Consequently, the gate voltage of the second FET 22 is decreased, and the resistance value between the drain and the source of the second FET 22 is increased. As a result, the supply of power to the load 12 from the battery 11 via the first FET 21 and the second FET 22 is stopped.

In the control device 10, the AND circuit 40 outputs a low-level voltage when the time period during which the output-end voltage Ve is less than the threshold voltage Vth becomes greater than or equal to a predetermined time period, i.e., when there is a high possibility that a failure has occurred, if the AND circuit 40 outputs a high-level voltage. Consequently, the output-end voltage Ve is decreased, and the supply of power via the first FET 21 and the second FET 22 is stopped.

Furthermore, the series circuit including the resistor 25a and the diode 29a and the series circuit including the resistor 25b and the diode 29b are connected in parallel. Accordingly, even if the passage of current via one of the resistors 25a and 25b is stopped, the passage of current is performed via the other resistor, and, therefore, the first FET and the second FET function appropriately.

If the passage of current via one of the resistors 25a and 25b is stopped, the non-short circuit voltage Ve1 and the short circuit voltage Ve2 are increased. Accordingly, even if the passage of current via one of the resistors 25a and 25b is stopped, the threshold voltage Vth is set to a voltage that is less than or equal to the non-short circuit voltage Ve1 and exceeds the short circuit voltage Ve2.

Specifically, the threshold voltage Vth is set to a voltage that is less than or equal to the non-short circuit voltage Ve1 if the passage of current is performed via all the resistors 25a and 25b and exceeds the short circuit voltage Ve2 if the passage of current is performed via only the resistor with the largest resistance value of the resistors 25a and 25b.

Note that if there is a low possibility that a large voltage is applied across the source and the gate of the first FET 21, it is not necessary to connect both ends of the switch 32 by the Zener diode 31b, and a commonly used diode may be connected in place of the Zener diode 31a. In this case, the diode is connected in the same manner as the Zener diode. Accordingly, the cathode and the anode of the diode are connected to the drain and the gate of the first FET 21. With this configuration as well, if the switch 32 is switched from off to on, the source and the gate are short-circuited in the first FET 21, and the gate voltage relative to the source potential is decreased to substantially zero V, regardless of the output-end voltage Ve. This prevents current from flowing from the source of the second FET 22 toward the source of the first FET 21. Furthermore, the diode prevents current from flowing through the resistor 27, the base of the switch 32, and the collector of the switch 32 in this order.

In addition, the switch 32 is not limited to an NPN bipolar transistor, and may be an N-channel FET, for example.

Embodiment 2

Figure 8:
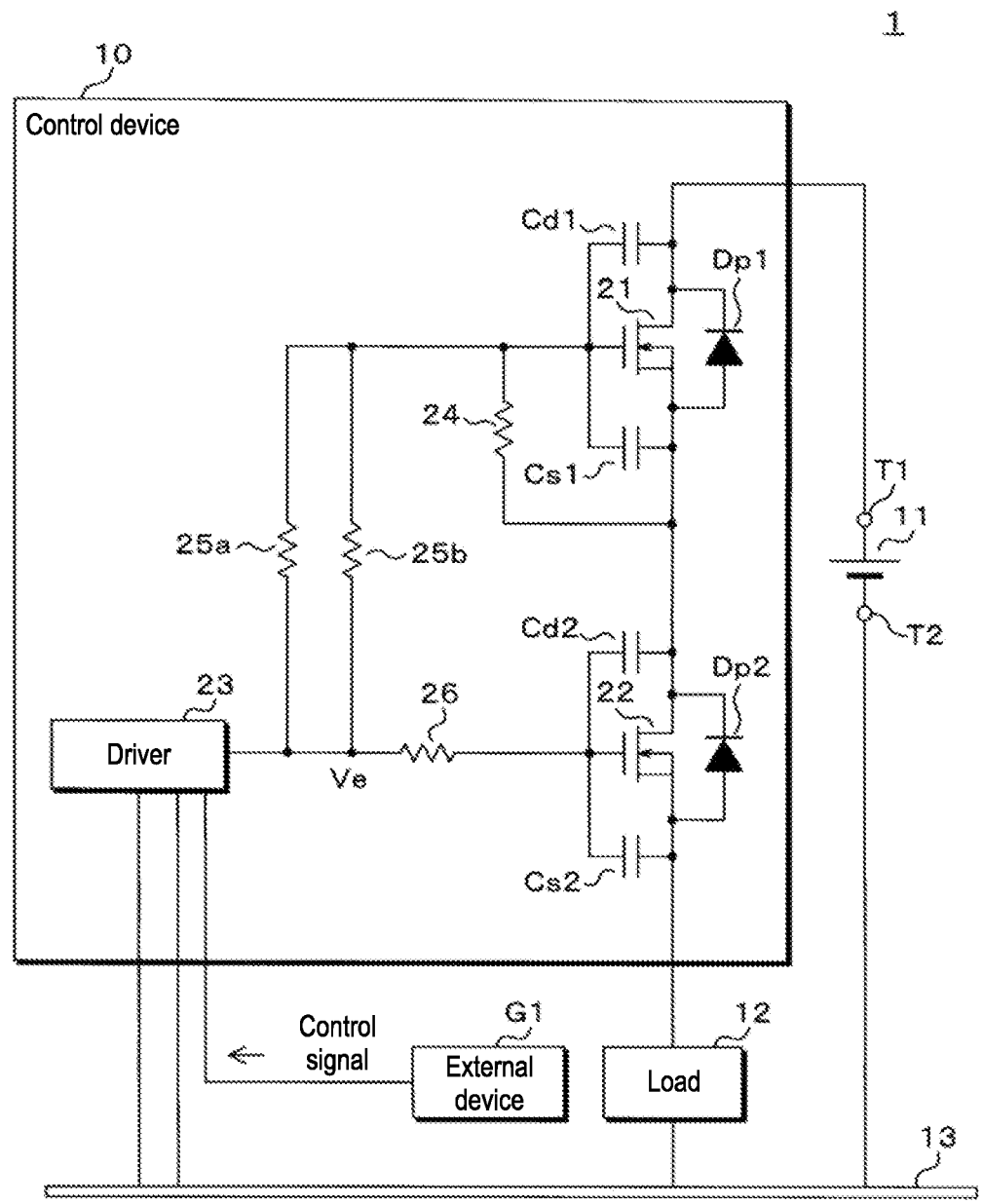
FIG. 8 is a circuit diagram of a power supply system according to Embodiment 2.

FIG. 8 is a circuit diagram of a power supply system 1 according to Embodiment 2.

In the following, aspects in which Embodiment 2 differs from Embodiment 1 will be described. Components of Embodiment 2 other than those described below are the same as those of Embodiment 1. Therefore, the components that are the same as those of Embodiment 1 are denoted by the same reference numerals as Embodiment 1, and the description thereof has been omitted.

The power supply system 1 of Embodiment 2 includes a control device 10, a battery 11, a load 12, and a conductor 13 as in Embodiment 1. These components are connected in the same manner as in Embodiment 1. The control device 10 of Embodiment 2 operates assuming that the positive electrode and the negative electrode of the battery 11 are connected to a positive electrode terminal T1 and a negative electrode terminal T2, respectively. The control device 10 of Embodiment 2 functions in the same manner as in Embodiment 1. Accordingly, the control device 10 electrically connects the positive electrode terminal T1 and the load 12 if the voltage of the control signal is switched from a low-level voltage to a high-level voltage. The control device 10 interrupts the electrical connection between the positive electrode terminal T1 and the load 12 if the voltage of the control signal is switched from a high-level voltage to a low-level voltage. Thus, the control device 10 controls the supply of power to the load 12 from the battery 11.

The control device 10 of Embodiment 2 includes a first FET 21, a second FET 22, a driver 23, and resistors 24, 25a, and 25b as in Embodiment 1. Except for the connection of the first FET 21 and the connection of the other end of each of the resistors 25a and 25b, these components are connected in the same manner as in Embodiment 1. The drain of the first FET 21 is connected to the positive electrode terminal T1. The source of the first FET 21 is connected to the drain of the second FET 22. One end of each of the resistors 25a and 25b is connected to the gate of the first FET 21. The driver 23 and the other end of each of the resistors 25a and 25b are connected to the gate of the second FET 22 via the resistor 26.

Accordingly, each of the resistors 25a and 25b is connected between the gates of the first FET 21 and the second FET 22. The resistor 24 is connected between the source and the gate of the first FET 21 as in Embodiment 1.

The driver 23 is configured in the same manner as in Embodiment 1. Accordingly, the other end of the resistor 45 is connected to the gate of the second FET 22 via the resistor 26. The discharge circuit 44 is further connected to the conductor 13 and the other end of the resistor 45.

The components of the driver 23 operate in the same manner as in Embodiment 1.

If the voltage that has been input from the AND circuit 40 is switched from a low-level voltage to a high-level voltage, the boost circuit 43 increases the voltage, relative to the potential of the conductor 13, of one end of the resistor 45 to a predetermined voltage that is higher than the voltage of the positive electrode terminal T1, i.e., the drain of the first FET 21. Consequently, the output-end voltage Ve, which is the voltage at the other end of the resistor 45, is increased, so that current flows through the parasitic capacitors Cd1 and Cs1 via the resistor 25a or the resistor 25b, and current flows through the parasitic capacitors Cd2 and Cs2 via the resistor 26. Consequently, the parasitic capacitors Cs1, Cd1, Cs2, and Cd2 are charged, the gate voltage relative to the source potential is increased in each of the first FET 21 and the second FET 22, and the resistance value between the drain and the source is decreased. As a result, the positive electrode terminal T1 and the load 12 are electrically connected, and the battery 11 supplies power to the load 12 via the first FET 21 and the second FET 22.

If the voltage that has been input from the AND circuit 40 is switched from a high-level voltage to a low-level voltage, the boost circuit 43 stops the application of the voltage to one end of the resistor 45. At this time, no current flows through the resistor 45, and, therefore, the voltages of both ends of the resistor 45 substantially match the output-end voltage Ve.

If the voltage that has been input from the inverter 42 is switched from a low-level voltage to a high-level voltage, the discharge circuit 44 electrically connects one end of the resistor 26 on the resistor 45 side to the conductor 13. Consequently, the parasitic capacitors Cs1, Cd1, Cs2, and Cd2 of the first FET 21 and the second FET 22 discharge, and the output-end voltage Ve is decreased. At this time, current flows through the discharge circuit 44 and the conductor 13 in this order via the resistor 25a or the resistor 25b from one end of each of the parasitic capacitors Cs1 and Cd1 on the resistor 24 side. Furthermore, current flows through the resistor 26, the discharge circuit 44, and the conductor 13 in this order from one end of each of the parasitic capacitors Cs2 and Cd2 on the resistor 26 side. Also, current flows through the resistor 24 from the one end of the parasitic capacitor Cs1 on the gate side of the first FET 21. Consequently, the gate voltage relative to the source potential is decreased in each of the first FET 21 and the second FET 22, and the resistance value between the drain and the source is increased. As a result, the electrical connection between the positive electrode terminal T1 and the load 12 is interrupted, and the supply of power to the load 12 is stopped.

If the voltage that has been input from the inverter 42 is switched from a high-level voltage to a low-level voltage, the discharge circuit 44 interrupts the electrical connection between the conductor 13 and the resistor 26. Consequently, the parasitic capacitors Cs2 and Cd2 stop discharging.

The AND circuit 40 instructs the boost circuit 43 to increase the voltage at the one end of the resistor 45 by outputting a high-level voltage, and instructs the discharge circuit 44 to decrease the output-end voltage Ve. In addition, the AND circuit 40 instructs the boost circuit 43 to stop the application of the voltage to the one end of the resistor 45 by outputting a low-level voltage, and instructs the discharge circuit 44 to decrease the output-end voltage Ve.

For example, if the drain and the source are short-circuited in one of the first FET 21 and the second FET 22, the control device 10 stops the supply of power to the load 12 from the battery 11 by turning off the other FET in which the drain and the source are not short-circuited.

In Embodiment 2, the output-end voltage Ve in the case where the voltage at the one end of the resistor 45 is a predetermined voltage Vs, and the drain and the gate of the first FET 21 are not short-circuited is referred to as a "non-short circuit voltage Ve1". The output-end voltage Ve in the case where the voltage at the one end of the resistor 45 is the predetermined voltage Vs, and the drain and the gate of the first FET 21 are short-circuited is referred to as a "short circuit voltage Ve2". In Embodiment 2, the non-short circuit voltage Ve1 is the predetermined voltage Vs, and the short circuit voltage Ve2 is the battery voltage Vb. The threshold voltage Vth is set to a voltage that is less than the non-short circuit voltage Ve1, i.e., the predetermined voltage Vs, and exceeds the short circuit voltage Ve2.

The function of the control device 10 in Embodiment 2 is the same as the function in Embodiment 1 shown in FIGS. 3 to 5, and the control device 10 of Embodiment 2 achieves the following effects as in Embodiment 1.

First, in the control device 10, the output-end voltage Ve is less than the threshold voltage Vth when the drain and the gate of the first FET 21 are short-circuited if the AND circuit 40 instructs the boost circuit 43 to increase the voltage at the one end of the resistor 45 to the predetermined voltage Vs by outputting a high-level voltage. At this time, the AND circuit 40 outputs a low-level voltage, the boost circuit 43 stops the application of the voltage to the one end of the resistor 45, and the discharge circuit 44 decreases the voltage at the one end of the resistor 45. Consequently, the gate voltage of the second FET 22 is decreased, and the resistance value between the drain and the source of the second FET 22 is increased. As a result, the supply of power to the load 12 from the battery 11 via the first FET 21 and the second FET 22 is stopped.

In the control device 10, the AND circuit 40 outputs a low-level voltage when a time period during which the output-end voltage Ve is less than the threshold voltage Vth becomes greater than or equal to a predetermined time period, i.e., when there is a high possibility that a failure has occurred if the AND circuit 40 outputs a high-level voltage. Consequently, the output-end voltage Ve is decreased, and the supply of power via the first FET 21 and the second FET 22 is stopped.

Furthermore, the resistors 25a and 25b are connected in parallel. Accordingly, even if the passage of current via one of the resistors 25a and 25b is stopped, the passage of current is performed via the other resistor, and, therefore, the first FET and the second FET function appropriately.

In the control device 10 of Embodiment 2, the electrical connection between the positive electrode terminal T1 and the load 12 is forcibly interrupted as in Embodiment 1 if, due to the occurrence of a failure in the boost circuit 43, the boost circuit 43 is unable to increase the voltage at the one end of the resistor 45 to the predetermined voltage, and the output-end voltage Ve does not become greater than or equal to the threshold voltage Vth.

Note that in Embodiments 1 and 2, the filter circuit 49 may be connected to a latch circuit, rather than to the AND circuit 40, and the latch circuit may be connected to the other input end of the AND circuit 40. In this case, the filter circuit 49 outputs a high-level voltage or a low-level voltage to the latch circuit. If the filter circuit 49 outputs a high-level voltage, the latch circuit outputs a high-level voltage to the AND circuit 40. If the voltage that is output by the filter circuit 49 to the latch circuit is switched to a low-level voltage, the latch circuit switches the voltage that is output to the AND circuit 40 to a low-level voltage. Consequently, the electrical connection between the positive electrode terminal T1 and the load 12 is forcibly interrupted. After the voltage that is output to the AND circuit 40 has been switched to a low-level voltage, the latch circuit maintains the voltage that is output to the AND circuit 40 at a low-level voltage, regardless of the voltage that is output by the filter circuit 49. In this case, even if the voltage of the control signal is switched to a low-level voltage, the forcible interruption will not be cancelled.

In Embodiment 1, the number of series circuits that are connected between the gates of the first FET 21 and the second FET 22, and include resistors and diodes is not limited to 2, and may be 1, or 3 or more. Likewise, in Embodiment 2, the number of resistors connected between the gates of the first FET 21 and the second FET 22 is not limited to 2, and may be 1, or 3 or more.

It should be appreciated that the embodiments disclosed herein are to be construed in all respects as illustrative and not limiting. The scope of the present disclosure is defined by the claims, rather than the description of the embodiments above, and is intended to include all modifications which fall within the scope of the claims and the meaning and scope of equivalents thereof

What is claimed is:

1. A control device comprising:
   an N-channel first FET;
   an N-channel second FET whose drain is connected to a drain (or a source) of the first FET;
   a first resistor that is connected between gates of the first FET and the second FET;
   a second resistor whose one end is connected to the gate of the second FET;
   a boost circuit that is connected to the other end of the second resistor, the boost circuit being configured to increase a voltage at the other end of the second resistor to a predetermined voltage that is higher than a voltage of the source (or the drain) of the first FET;
   a buck circuit configured to decrease a voltage at the one end of the second resistor; and
   an instructing unit configured to instruct the boost circuit to increase the voltage at the other end of the second resistor,
   wherein the instructing unit is configured to instruct the buck circuit to decrease the voltage at the one end of the second resistor when the voltage at the one end of the second resistor is less than a threshold voltage if the instructing unit instructs the boost circuit to increase the voltage at the other end of the second resistor,
   the threshold voltage is less than the predetermined voltage, and
   the threshold voltage exceeds the voltage at the one end of the second resistor if the voltage at the other end of the second resistor is the predetermined voltage and if the source (or the drain) and the gate of the first FET are short-circuited.

2. The control device according to claim 1, comprising a voltage maintaining member configured to maintain a voltage between the source and the gate of the first FET at less than or equal to a second predetermined voltage.

3. The control device according to claim 2, comprising a switch,
   wherein the voltage maintaining member is a Zener diode,
   a cathode of the voltage maintaining member is connected to the source of the first FET, and
   an anode of the voltage maintaining member is connected to the gate of the first FET via the switch.

4. The control device according to claim 1, comprising:
   a switch; and
   a diode whose cathode is connected to the source of the first FET, and whose anode is connected to the gate of the first FET via the switch.

5. The control device according to claim 1, wherein the instructing unit is configured to instruct the buck circuit to decrease the voltage at the one end of the second resistor when a time period during which the voltage at the one end of the second resistor is less than the threshold voltage is greater than or equal to a predetermined time period if the instructing unit instructs the boost circuit to increase the voltage at the other end of the second resistor.

6. The control device according to claim 1, wherein the number of the first resistors is 2 or more.

7. The control device according to claim 2, wherein the instructing unit is configured to instruct the buck circuit to decrease the voltage at the one end of the second resistor when a time period during which the voltage at the one end of the second resistor is less than the threshold voltage is greater than or equal to a predetermined time period if the instructing unit instructs the boost circuit to increase the voltage at the other end of the second resistor.

8. The control device according to claim 3, wherein the instructing unit is configured to instruct the buck circuit to decrease the voltage at the one end of the second resistor when a time period during which the voltage at the one end of the second resistor is less than the threshold voltage is greater than or equal to a predetermined time period if the instructing unit instructs the boost circuit to increase the voltage at the other end of the second resistor.

9. The control device according to claim 4, wherein the instructing unit is configured to instruct the buck circuit to decrease the voltage at the one end of the second resistor when a time period during which the voltage at the one end of the second resistor is less than the threshold voltage is greater than or equal to a predetermined time period if the instructing unit instructs the boost circuit to increase the voltage at the other end of the second resistor.

10. The control device according to claim 2, wherein the number of the first resistors is 2 or more.

11. The control device according to claim 3, wherein the number of the first resistors is 2 or more.

12. The control device according to claim 4, wherein the number of the first resistors is 2 or more.

* * * * *